(12) United States Patent
Akiyama

(10) Patent No.: US 7,167,301 B2
(45) Date of Patent: Jan. 23, 2007

(54) SEMICONDUCTOR OPTICAL AMPLIFIER SUITABLE FOR COARSE WDM COMMUNICATIONS AND LIGHT AMPLIFICATION METHOD

(75) Inventor: Tomoyuki Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 175 days.

(21) Appl. No.: 10/708,219

(22) Filed: Feb. 17, 2004

(65) Prior Publication Data

US 2004/0196543 A1 Oct. 7, 2004

(30) Foreign Application Priority Data

Mar. 20, 2003 (JP) ............... 2003-076893

(51) Int. Cl.
*H10S 5/0683* (2006.01)
(52) U.S. Cl. ..................................... 359/344
(58) Field of Classification Search ................. 359/344
See application file for complete search history.

(56) References Cited

U.S. PATENT DOCUMENTS

| | | | | |
|---|---|---|---|---|
| 3,828,231 | A * | 8/1974 | Yamamoto | 359/344 |
| 4,736,164 | A * | 4/1988 | Henning | 359/344 |
| 4,794,346 | A | 12/1988 | Miller | 330/4.3 |
| 4,852,108 | A * | 7/1989 | Utaka et al. | 372/20 |
| 5,224,114 | A * | 6/1993 | Ikeda et al. | 372/45.01 |
| 5,379,318 | A * | 1/1995 | Weber | 372/96 |
| 5,521,754 | A * | 5/1996 | Nitta et al. | 359/344 |
| 5,539,571 | A * | 7/1996 | Welch et al. | 359/344 |
| 5,604,628 | A * | 2/1997 | Parker et al. | 359/344 |
| 5,608,572 | A * | 3/1997 | Nitta et al. | 359/344 |
| 5,793,521 | A * | 8/1998 | O'Brien et al. | 359/344 |
| 5,946,336 | A * | 8/1999 | Mizutani et al. | 372/50.1 |
| 6,128,324 | A * | 10/2000 | Shah et al. | 372/50.22 |
| 6,215,585 | B1 * | 4/2001 | Yoshimura et al. | 359/344 |
| 6,487,007 | B1 * | 11/2002 | Morito | 359/344 |
| 6,563,631 | B2 * | 5/2003 | Delprat et al. | 359/344 |
| 6,650,675 | B2 * | 11/2003 | Sahara et al. | 372/50.11 |
| 6,678,289 | B2 * | 1/2004 | Kim | 372/20 |
| 2002/0093731 | A1 | 7/2002 | Tombling et al. | 359/344 |

FOREIGN PATENT DOCUMENTS

| | | |
|---|---|---|
| JP | 63-213384 | 9/1988 |
| JP | 3-284892 | 12/1991 |
| JP | 5-267795 | 10/1993 |
| JP | 2000-340883 | 12/2000 |
| JP | 2002-344090 | 11/2002 |

* cited by examiner

*Primary Examiner*—Thomas H. Tarcza
*Assistant Examiner*—Ari M. Diacou
(74) *Attorney, Agent, or Firm*—Armstrong, Kratz, Quintos, Hanson & Brooks, LLP

(57) ABSTRACT

An active layer contains quantum structures. The active layer amplifies light propagating therein while current is injected therein. Electrodes are provided for sections of the active layer sectionalized along a light propagation direction. The electrodes inject different currents into the sections. Current is supplied to the electrodes in such a manner that a first current density is set to one section of the active layer and a second current density is set to another section. The first current density is lower than that at a cross point and the second current density is higher than that at the cross point. The cross point is a cross point between gain coefficient curves at least two different transition wavelengths of the quantum structures. The curves are drawn in a graph showing a relation between a density of current injected into the active layer and a gain coefficient of the active layer.

10 Claims, 17 Drawing Sheets

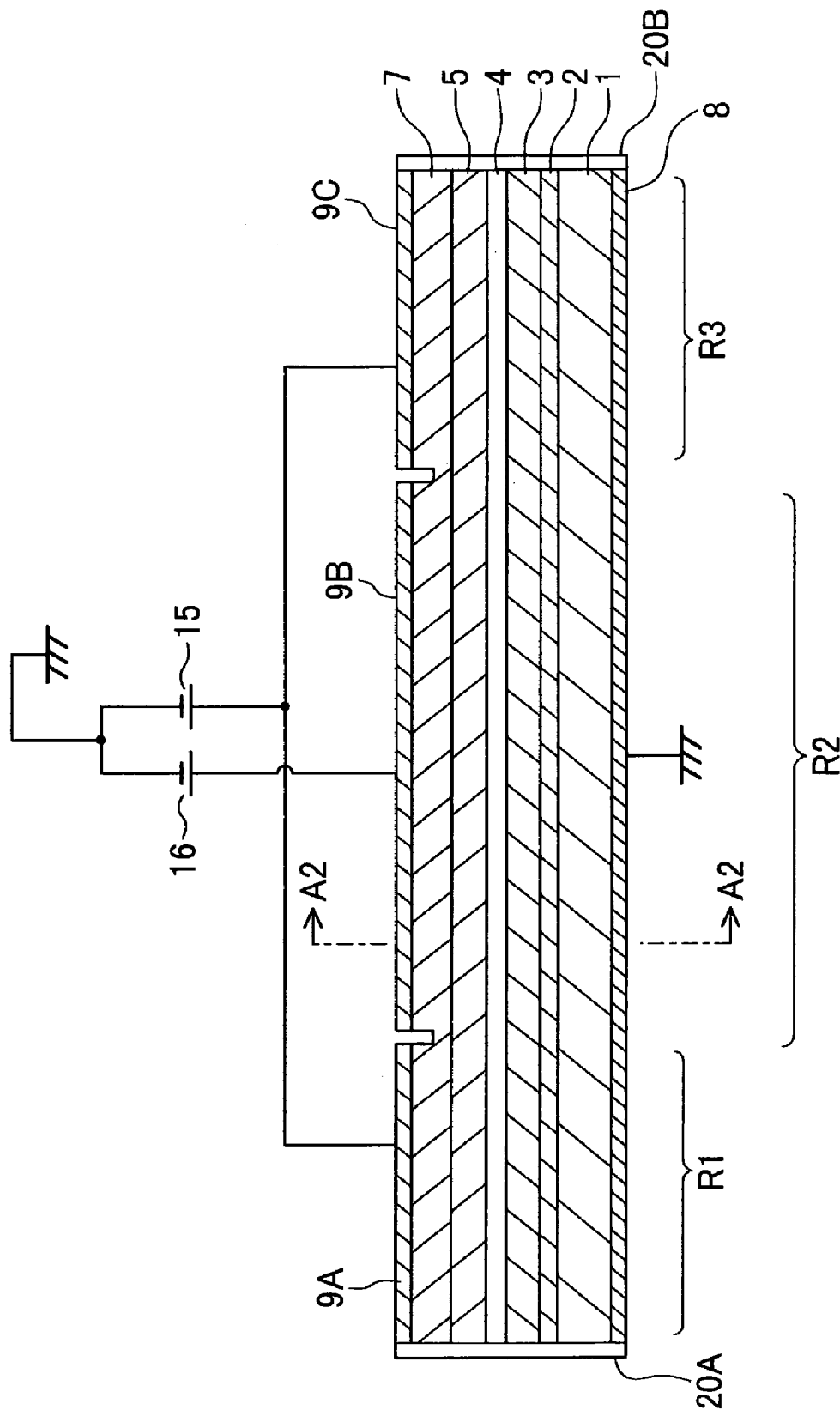

SEMICONDUCTOR OPTICAL AMPLIFIER SUITABLE FOR COARSE WDM COMMUNICATIONS AND LIGHT AMPLIFICATION METHOD

CROSS REFERENCE TO RELATED APPLICATIONS

This application is based on and claims priority of Japanese Patent Application No. 2003-76893 filed on Mar. 20, 2003, the entire contents of which are incorporated herein by reference.

BACKGROUND OF THE INVENTION

A) Field of the Invention

The present invention relates to a semiconductor optical amplifier and a light amplification method, and more particularly to a semiconductor optical amplifier which induces optical amplification upon flowing current and introducing light into an active layer containing quantum dots, quantum wires or quantum dashes and to a light amplification method.

B) Description of the Related Art

For the cost reduction of metro optical networks and access optical networks, it is expected that coarse Wavelength Division Multiplexing (WDM) having a wide interchannel wavelength (about 20 nm) will be widely used. Coarse WDM does not require precise control over the wavelengths of light sources and filters and permits a wavelength fluctuation to some degree. The cost reduction is therefore possible because it is not necessary to use a cooler for controlling the temperature of a semiconductor laser used as a light source, or from other reasons.

The wavelength range actually used is from 1.3 µm to 1.6 µm. A single conventional optical amplifier having a bandwidth of about 0.05 µm cannot cover the whole wavelength range actually used. If an optical amplifier is to be prepared for each usable wavelength band, this requirement contradicts the cost reduction.

Japanese Patent Laid-open Publication No. 2002-344090 discloses a semiconductor optical amplifier having quantum dots. Quantum dots are used in an active layer of the semiconductor optical amplifier so that the volume of the active layer can be reduced and a carrier density in the active layer at a limited current density can be increased. Since the carrier density can be increased, a gain spectrum can be broadened.

Another related art is disclosed in Japanese Patent Laid-open Publication No. HEI-5-267795.

Although the gain spectrum can be broadened by using quantum dots in the active layer of a semiconductor optical amplifier, the gain is largely dependent upon the wavelength. This semiconductor optical amplifier is difficult to be used as a broadband optical amplifier used in coarse WDM.

SUMMARY OF THE INVENTION

An object of the present invention is to provide a semiconductor optical amplifier having a small wavelength dependency of a gain and a light amplification method.

According to another aspect of the present invention, there is provided a semiconductor optical amplifier comprising: an active layer containing a quantum structure of any of quantum dots, quantum wires and quantum dashes, the active layer amplifying light propagating therein while current is injected therein; electrodes provided for a plurality of sections of the active layer sectionalized along a light propagation direction, the electrodes being able to inject different currents into the sections; and a power supply for supplying current to the electrodes in such a manner that a first current linear density is set to at least one section of the active layer and a second current linear density is set to at least another section, the first current linear density being lower than a current linear density at a cross point and the second current linear density being higher than the current linear density at the cross point, the cross point being a cross point between gain coefficient curves of at least two different transition wavelengths of the quantum structures, the curves being drawn in a graph showing a relation between a density of current injected into the active layer and a gain coefficient of the active layer.

With this configuration, it is possible to reduce a gain difference between two transition wavelength ranges.

According to one aspect of the present invention, there is provided a semiconductor optical amplifier comprising: an active layer containing quantum structures of any of quantum dots, quantum wires and quantum dashes, the active layer amplifying light propagating therein while current is injected therein; electrodes provided for a plurality of sections of the active layer sectionalized along a light propagation direction, each section belonging to a group selected from at least two groups, and the electrodes injecting different currents into the sections; and a power supply for supplying current to the electrodes in such a manner that current is supplied at a same current linear density to the sections belonging to the same group and current is supplied at different current linear densities to the sections belonging to different groups.

Sections at the same current linear density are disposed dispersively. The length of each section can therefore be made short. It is possible to prevent light in a specific wavelength range from being excessively amplified so that gain saturation can be suppressed.

According to still another aspect of the present invention, there is provided a light amplification method comprising the steps of: (a) injecting current into a first region of an active layer containing quantum structures made of at least ones of quantum dots, quantum wires and quantum dashes, at a current linear density satisfying that a gain coefficient of the quantum structures at the longest transition wavelength of the quantum structures becomes larger than a gain coefficient at the second longest transition wavelength, and injecting current into a second region different from the first region at a current linear density satisfying that the gain coefficient of the quantum structures at the longest transition wavelength becomes smaller than the gain coefficient at the second longest transition wavelength; and (b) amplifying a laser beam introduced into the active layer while the current is injected into the active layer.

With this method, it is possible to reduce a gain difference between two transition wavelength ranges.

As above, the gain can be made constant over a wide wavelength range by suppressing gain saturation.

BRIEF DESCRIPTION OF THE DRAWINGS

FIG. 1 is a cross sectional view of a semiconductor optical amplifier according to a first embodiment.

DESCRIPTION OF THE PREFERRED EMBODIMENTS

Prior to describing the embodiments of the invention, description will be made on some issues accompanied by the operation of a conventional semiconductor optical amplifier. A conventional optical amplifier has the structure that, for example, on an n-type GaAs substrate, an n-type AlGaAs clad layer, a GaAs lower light confinement layer, an active layer, a GaAs upper light confinement layer and a p-type AlGaAs clad layer are stacked in this order.

The active layer has the structure that, for example, ten quantum dot layers and nine GaAs layers are alternately stacked. The thickness of each quantum dot layer is 25 nm and the thickness of each GaAs layer is also 25 nm. The quantum dot layer has a number of quantum dots made of InAs and irregularly distributed on the underlayer surface. The underlayer surface not disposed with the quantum dots is covered with a wetting layer made of InGaAs.

Figure 13:
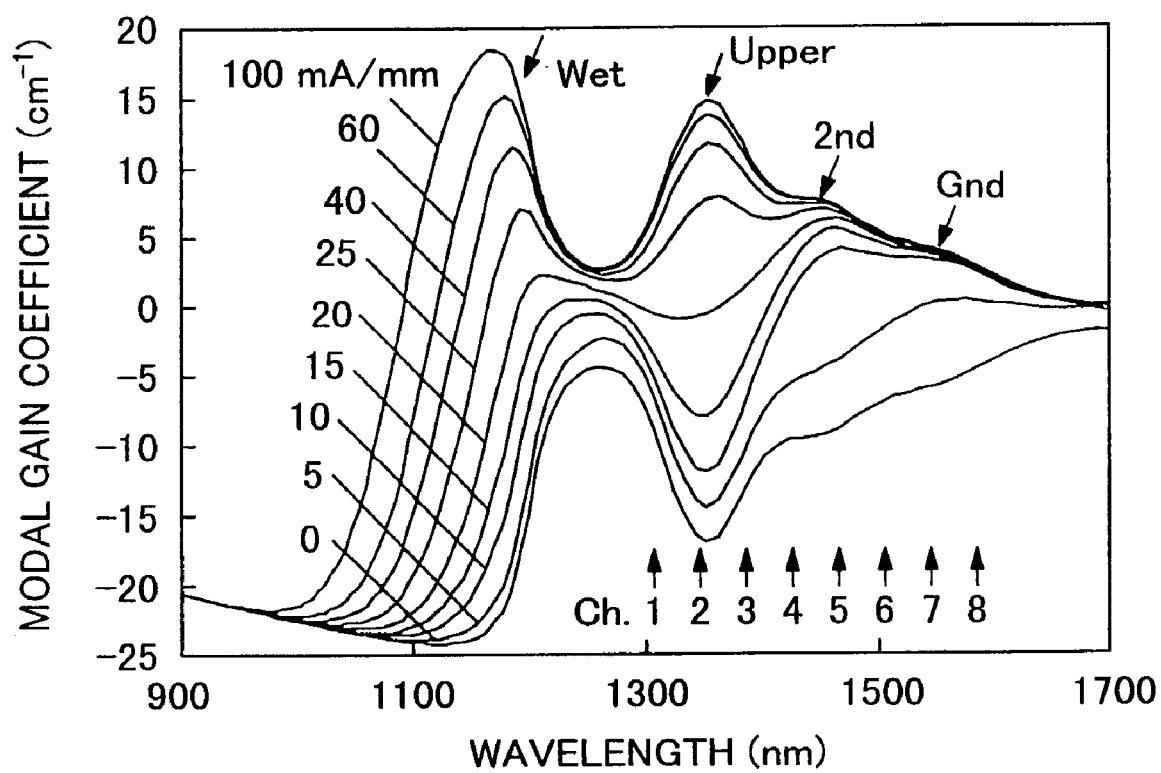
FIG. 13 is a graph showing a wavelength dependency of a modal gain coefficient of a conventional semiconductor optical amplifier.

FIG. 13 shows the wavelength dependency of a modal gain coefficient of the active layer. The abscissa represents a wavelength in the unit of "nm" and the ordinate represents a modal gain coefficient in the unit of "cm$^{-1}$". Each numerical value appended to each curve shown in FIG. 13 represents a current linear density injected into the active layer. The current linear density means a current per unit length of the active layer. The modal gain coefficient is constant even if the width of the active layer changes, so long as the current per unit length is constant.

"Gnd" in FIG. 13 indicates the longest transition wavelength of quantum dots. The longest transition wavelength is a wavelength corresponding to a difference between an electron ground level and a hole ground level. "2nd" in FIG. 13 indicates the second longest transition wavelength of quantum dots, and "Upper" indicates the third longest transition wavelength of quantum dots. These transition wavelengths are defined by a pair of an electron level and a hole level. Which pairs of an electron level and a hole level correspond to the second and third longest transition wavelengths is determined by the material and structure of the semiconductor optical amplifier. Higher order levels are very near each other so that these levels are usually difficult to observe distinguishably. Therefore, the third longest transition wavelength indicated by "Upper" in FIG. 13 may correspond to a plurality of electron levels and hole levels. "Wet" in FIG. 13 indicates a transition wavelength of the wetting layer.

In this specification, the "transition wavelength" means a wavelength at which the radiative spectrum of the quantum structure takes the maximum value.

"Ch.1 to Ch. 8" in FIG. 13 indicate the wavelengths of respective channels, first to eighth channels used in coarse WDM.

As seen from FIG. 13, the modal gain coefficient varies widely at each channel. For example, at an injection current of 100 mA/mm and an amplifier length of 25 mm, the gain at the eighth channel is 28 dB and the gain at the second channel is 150 dB. If the gain of 28 dB is retained at the eighth channel, a low reflection film coating resistant to the second channel gain of 150 dB is necessary. This is, however, difficult. Although the gains of the channels maybe equalized by using gain equalizing filters, the attenuation amount for the channel having a large gain is required to be very large. This results in an expensive filter. In addition, power is wastefully consumed.

Figure 14:
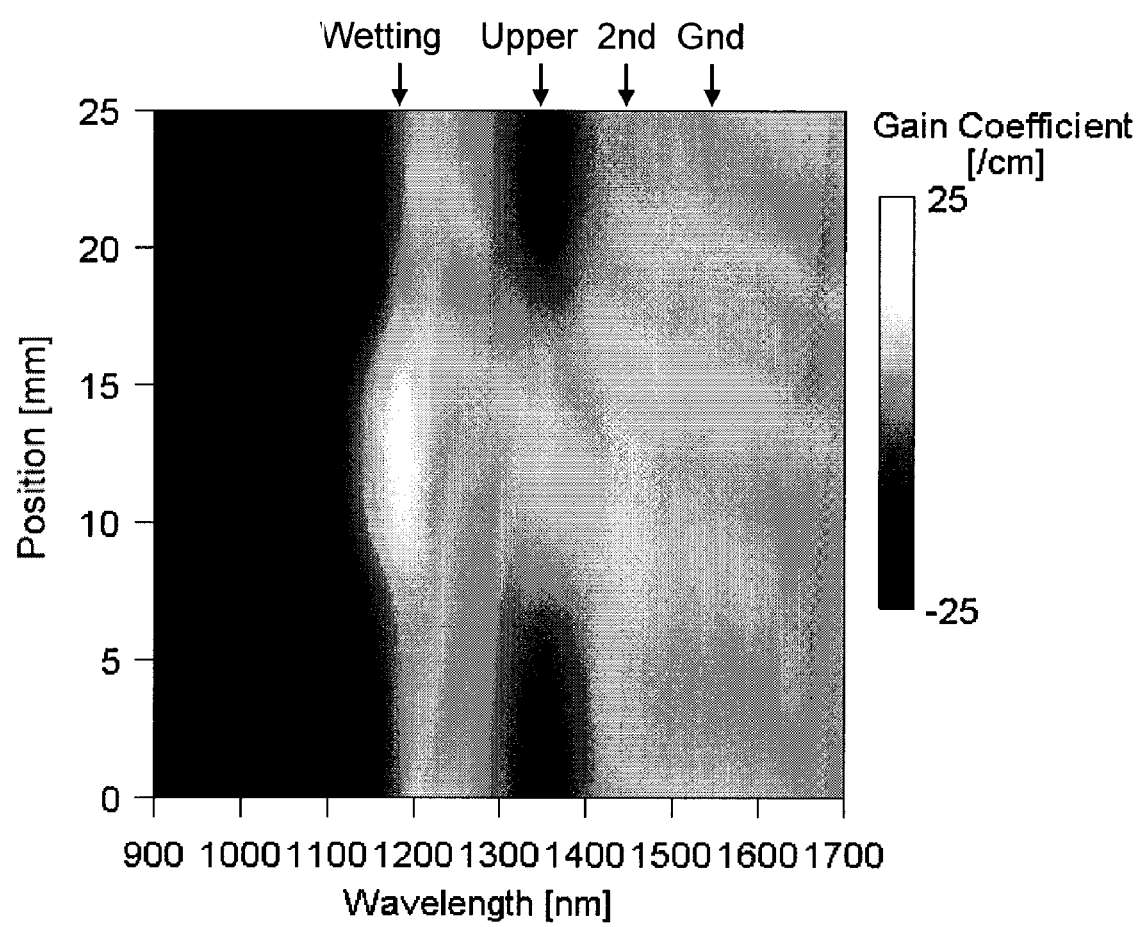
FIG. 14 is a diagram showing the distribution of gain coefficients in the active layer of a conventional semiconductor optical amplifier.
Figure 15:
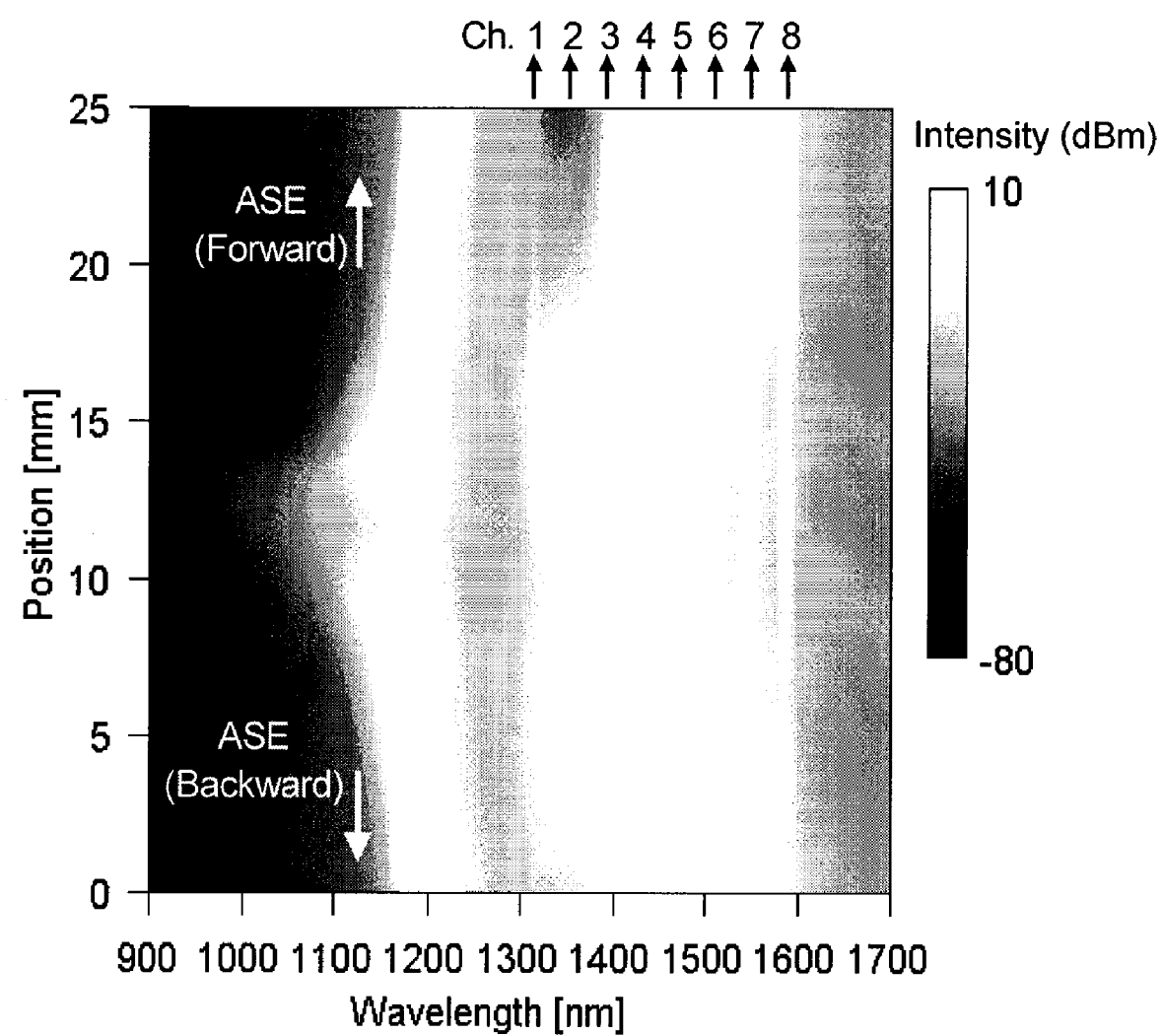
FIG. 15 is a diagram showing the distribution of light intensities in the active layer of a conventional semiconductor optical amplifier.

FIG. 14 shows the distribution of gain coefficients along a light propagation direction. The abscissa represents a wavelength in the unit of "nm" and the ordinate represents a position along the light propagation direction in the unit of "mm". The gain coefficient is indicated by shading. FIG. 15 shows the distribution of light intensities along the light propagation direction. The abscissa and ordinate represent the same as those in FIG. 14. A light intensity is indicated by shading.

It can be seen that spontaneous emission occurs in the transition wavelength range of the wetting layer and this emission is amplified. Because of this amplified spontaneous emission (ASE), the gain is saturated so that the gain in the wavelength range from 1300 to 1400 nm lowers near at the end faces or facets (near at the positions of 0 mm and 25 mm). As shown in FIG. 15, therefore, the light intensity at the output ends of the first to third channels becomes lower than that in the other channels.

Figure 16A:
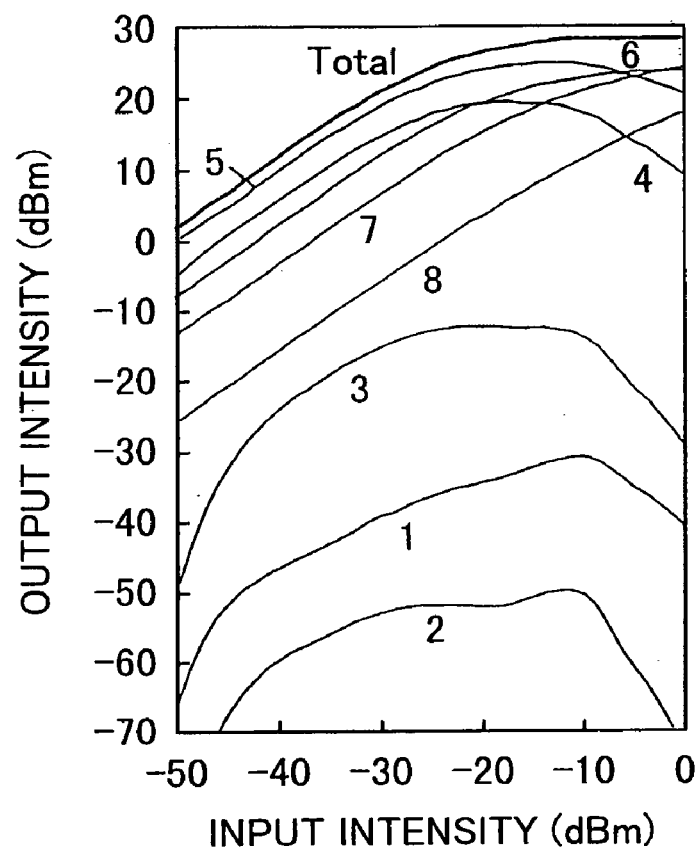
FIG. 16A is a graph showing the relation between an output light intensity and an input light intensity.

FIG. 16A shows the relation between an input light intensity and an output light intensity. The abscissa represents an input light intensity in the unit of "dBm" and the ordinate represents an output light intensity in the unit of "dBm". Numerical values appended to curves shown in FIG. 16A represent the channel numbers. It can be seen that the output light intensity varies widely among the channels and that the gains in the first to third channels are saturated remarkably.

Figure 16B:
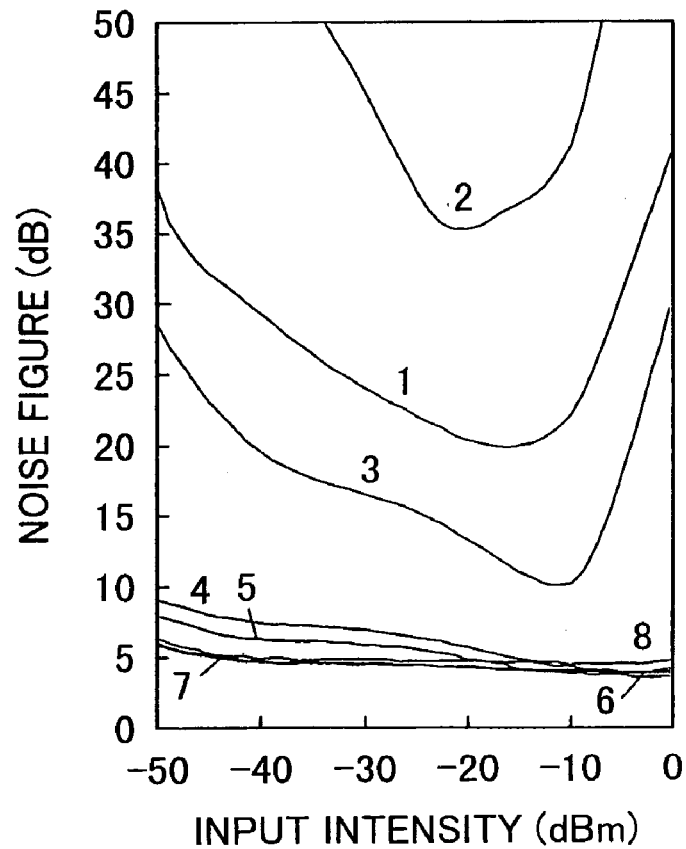
FIG. 16B is a graph showing the relation between a noise figure and an input light intensity, respectively of a conventional semiconductor optical amplifier.

FIG. 16B shows the relation between an input light intensity and a noise figure. The abscissa represents an input light intensity in the unit of "dBm" and the ordinate represents a noise figure in the unit of "dB". It can be seen that the noise figure is degraded in the first to third channels having the remarkable gain saturation. The noise figure is degraded because the carrier inversion distribution becomes incomplete due to the gain saturation.

The gain saturation can be mitigated by the semiconductor optical amplifiers of the embodiments described hereinunder.

FIG. 1 is a cross sectional view of a semiconductor optical amplifier of the first embodiment as viewed along a direction parallel to the light propagation direction. On a substrate 1 made of n-type InP, a buffer layer 2 made of n-type InP and having a thickness of 100 to 200 nm is epitaxially grown. The buffer layer 2 is used for providing an underlayer surface having good crystallinity. If the crystallinity of the substrate 1 is good, the butter layer 2 may be omitted. On the buffer layer 2, a clad layer 3 is formed which is made of n-type InP and has a thickness of 3 μm. The n-type impurity concentration of each of the substrate 1, buffer layer 2 and clad layer 3 is $1 \times 10^{18}$ cm$^{-3}$ for example.

On the clad layer 3, an active layer 4 of 0.5 μm in thickness is formed. The active layer 4 contains quantum dots having a tensile strain. The structure of the active layer 4 will be later described.

On the active layer 4, a clad layer 5 of p-type InP is epitaxially grown to a thickness of 3 μm. On the clad layer 5, a contact layer 7 is epitaxially grown which is made of p-type $In_{0.53}Ga_{0.47}As$ and has a thickness of 0.5 μm. For example, the p-type impurity concentration of the clad layer 5 is $1 \times 10^{18}$ cm$^{-3}$ and the p-type impurity concentration of the contact layer 7 is $1 \times 10^{19}$ cm$^{-3}$.

The epitaxial growth of these layers can be performed by molecular beam epitaxy (MBE) or metal organic chemical vapor deposition (MOCVD). If MBE is used, solid of each constituent element is used as a source material, i.e., Be is used as the p-type impurities and Si is used as the n-type impurities. If MOCVD is used, trimethylindium is used as the In source material, phosphine is used as the P source material, trimethylaluminum is used as the Al source material, triethylgallium is used as the Ga source material, diethylzinc is used as the Zn source material which is used as the p-type impurities, and disilane or the like is used as the Si source material which is used as the n-type impurities. The growth temperature of the quantum dot layer is 450° C. and the growth temperature of the other layers is 600 to 700° C.

The optical amplifier of the first embodiment is sectionalized into three regions R1, R2 and R3 along the light propagation direction. The surfaces of the contact layer 7 corresponding to the regions R1, R2 and R3 are formed with p-side electrodes 9A, 9B and 9C, respectively. The p-side electrodes 9A, 9B and 9C are formed by depositing an electrode layer on the whole surface of the contact layer 7 and forming grooves shallower than the bottom of the contact layer along the boundaries of the regions R1, R2 and R3. These grooves electrically separate the p-side electrodes 9A to 9C. An n-side electrode 8 is formed on the bottom of the substrate 1. The light input and output surfaces are coated with antireflection films 20A and 20B.

Figure 2A:
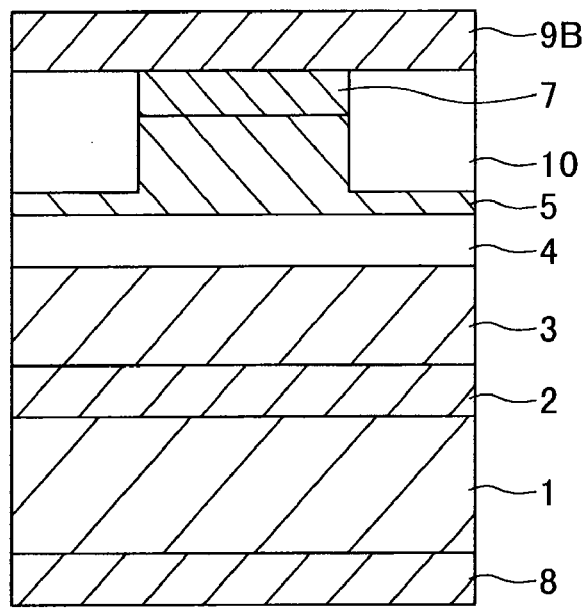
FIGS. 2A and 2B are cross sectional views of the semiconductor optical amplifier of the first embodiment and a semiconductor optical amplifier according to a modification of the first embodiment.

FIG. 2A is a cross sectional view taken along one-dot chain line A2—A2 shown in FIG. 1. The lamination structure from the substrate 1 to the contact layer 7 is the same as that described with reference to FIG. 1. The contact layer 7 and clad layer 5 are partially etched to form a striped ridge structure. Insulating layers 10 cover the both sides of the ridge structure. The width of the ridge structure is several μm, the width of the substrate 1 is about 1 mm and the length thereof is about 0.3 to 30 mm.

The n-side electrode 8 is formed on the bottom of the substrate 1 and the p-side electrode 9B is formed on the contact layer 7 and insulating layers 10.

Although the optical amplifier shown in FIG. 2A has the ridge structure, it may have a buried type structure.

Figure 2B:
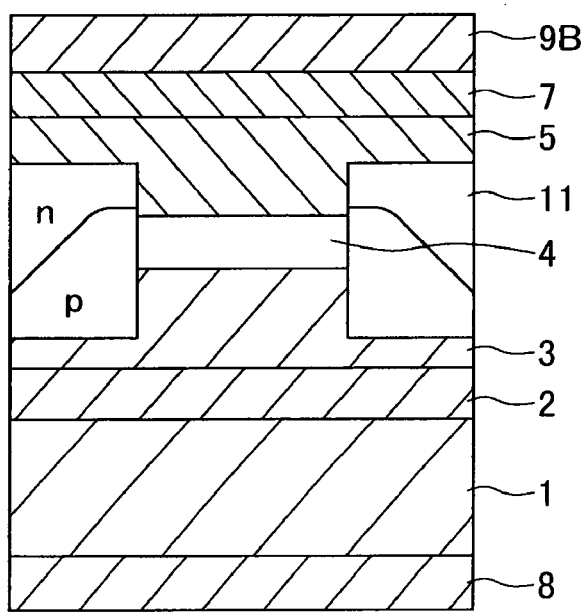

FIG. 2B is a cross sectional view of an optical amplifier having a buried structure. The lamination structure is the same as that of the ridge structure shown in FIG. 2A. In the case of the buried structure, the widths of the active layer 4 and the clad layers 3 and 5 in contact with the active layer are partially limited. In these width-limited regions, buried structures 11 are formed which have the light confinement effect and the current confinement effect. The buried structure 11 includes, for example, an n-type InP layer in contact with the p-type clad layer 3 and a p-type InP layer in contact with the n-type clad layer 5.

The buried structures are formed by growing the clad layer 5 to some thickness, thereafter forming a striped hard mask, etching both side regions of the hard mask, and selectively growing the buried structures. Thereafter, the clad layer 5 is grown to the remaining thickness and the contact layer 7 is grown.

Figure 3A:
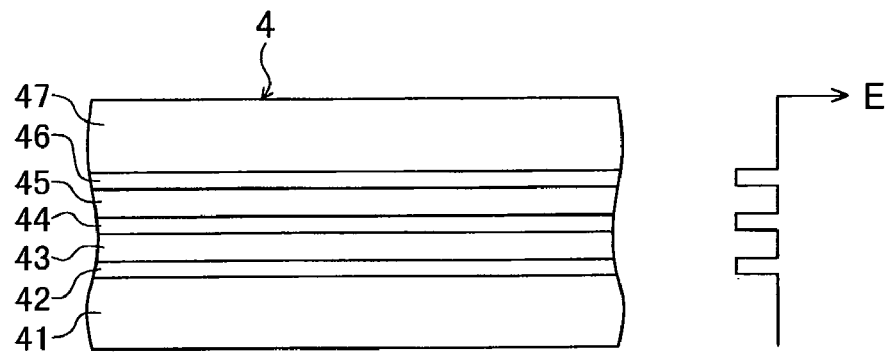
FIG. 3A is a cross sectional view of an active layer of the semiconductor optical amplifier of the first embodiment.

FIG. 3A shows an example of the structure of the active layer 4. The active layer 4 has a barrier layer 41 made of undoped $In_{0.53}(Al_{0.5}Ga_{0.5})_{0.47}As$ and lattice-matched with the InP substrate, and a quantum dot layer 42 formed on the barrier layer 41 and made of $In_{0.1}Ga_{0.9}As$ having a smaller lattice constant and a narrower band gap than those of the barrier layer. The quantum dot layer 42 has a thickness of, e.g., one to six-atom layer. Because the quantum dot layer 42 is not lattice-matched with the underlying barrier layer 41, it is grown in the S-K mode and does not form a continuous and uniform film.

Figure 3B:
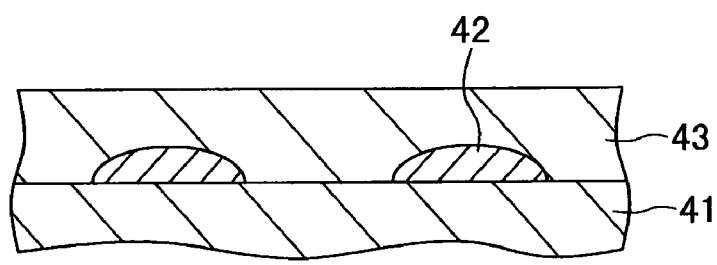
FIG. 3B is a cross sectional view of quantum dots.

FIG. 3B schematically shows the structure of a quantum dot layer. Quantum dots 42 are formed on the underlying barrier layer 41 in a dispersed island pattern. For example, the quantum dot 42 has a diameter of about 20 nm on a plane surface and a thickness (height) of about 5 nm.

Reverting to FIG. 3A, on the quantum dot layer 42, a barrier layer 43, a quantum dot layer 44, a barrier layer 45, a quantum dot layer 46 and a barrier layer 47 are stacked in this order. The structures of the quantum dot layers 44 and 46 are the same as that of the quantum layer 42. The materials of the barrier layers 43, 45 and 47 are the same as that of the barrier layer 41. The thickness of each of the barrier layers 43 and 45 is about 30 nm.

Because the quantum dot layers 42, 44 and 46 have a band gap narrower than that of the barrier layer, the conduction band structure is as shown in the right area of FIG. 3A. The uppermost and lowermost barrier layers may be made thicker than the intermediate barrier layer.

As shown in FIG. 3B, the barrier layer 43 buries the quantum dots 42 and becomes continuous with the underlying barrier layer 41. When quantum dots are grown in the S-K mode, a wetting layer may be formed between the barrier layers 43 and 41.

In the structure shown in FIG. 3A, three quantum dot layers are buried in the barrier layers. The three quantum dot layers are made of the material having the lattice constant smaller than that of the barrier layer. Therefore, a tensile stress is generated in quantum dots 42. Namely the quantum dot layers 42, 44 and 46 are layers having a tensile strain. Although three quantum dot layers are formed in the example shown in FIG. 3A, the number of quantum dot layers can be selected as desired in the range from 1 to about 20 layers.

Figure 3C:
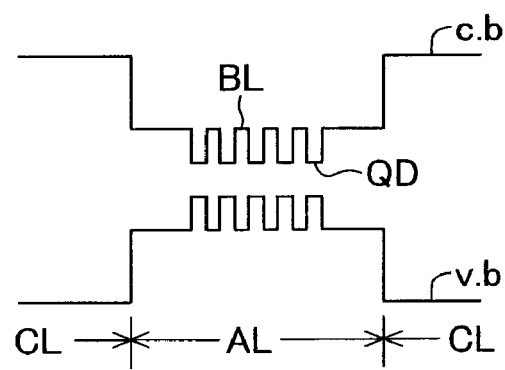
FIG. 3C is an energy band diagram of an active layer.

FIG. 3C is a schematic diagram showing the band structure of an active layer having five quantum dot layers. The band structure shows a conduction band lower edge c.b and a valence band upper edge v.b of an active layer AL and clad layers CL on both sides of the active layer. The lateral direction in FIG. 3C corresponds to a laminating direction. The band gap is narrow in a quantum dot layer QD so that the radiative recombination of electrons and holes occurs preferentially in the quantum dot layer QD. The barrier layers BL and clad layers CL have a band gap broader than that of the quantum dot layer QD so that they are transparent to emission from quantum dots.

Description continues by reverting to FIG. 1. The p-side electrode 8 is grounded. A power supply 15 applies a voltage to the electrode 9B formed on the surface of the region R2. A power supply 16 applies a voltage to the electrodes 9A and 9C formed on the surfaces of the regions R1 and R3. Upon application of the voltages, current is injected into the active layer 4. The electrode 9B on the region R2 is electrically separated from the electrodes 9A and 9C on the regions R1 and R3. It is therefore possible to inject current independently into the active layer 4 in the region R2 and into the active layer 4 in the regions R1 and R3.

The following description is directed to a suitable magnitude of injection current.

Figure 4:
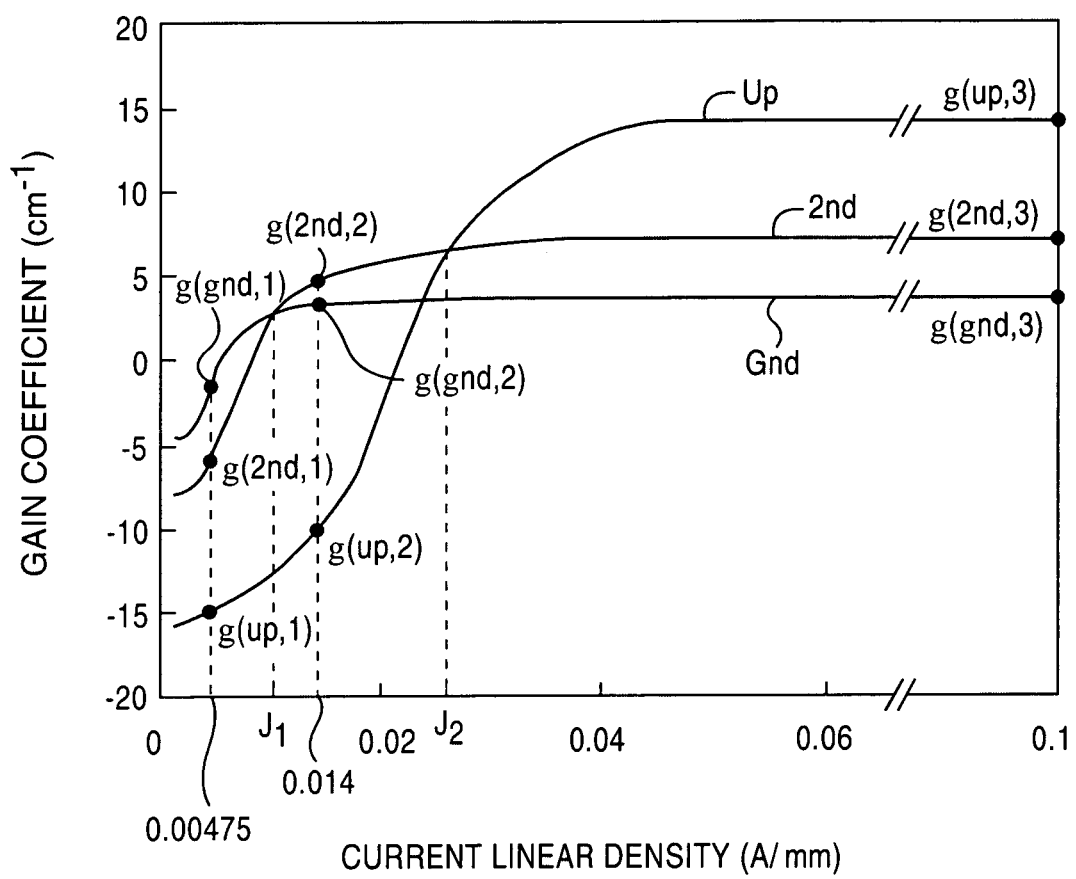
FIG. 4 is a graph showing the relation between a gain coefficient and a current linear density of a semiconductor optical amplifier.

FIG. 4 shows a current linear density dependency of a gain coefficient per unit length of the active layer 4. The abscissa represents a density of injection current into the active layer in the unit of "A/mm" and the ordinate represents a gain per unit length (gain coefficient) in the unit of "cm$^{-1}$".

Levels of electrons and holes in a quantum dot are distributed dispersively. For example, electron levels in the conduction band include a ground level, a second level, a third level, and higher levels. Similarly, hole levels in the valence band include a ground level, a second level, a third level, and higher levels. Transition of carriers between these levels stimulates light emission.

Because there are a plurality of electron and hole levels, there are a plurality of transition wavelengths of quantum dots. The longest transition wavelength corresponds to an energy difference between an electron ground level and a hole ground level. A transition wavelength associated with higher order levels is shorter than the transition wavelength associated with ground levels. Which pairs of an electron level and a hole level correspond to the second and third longest transition wavelengths is determined by the material, structure and the like of quantum dots and barrier layers.

Third and higher order levels are very near each other so that the third longest transition wavelength may correspond to transition associated with these higher order levels.

Curves "Gnd", "2nd" and "Up" shown in FIG. 4 indicate the gain coefficients of light having the longest transition wavelength (first transition wavelength), second longest transition wavelength (second transition wavelength) and third longest transition wavelength (third transition wavelength) respectively of quantum dots. The gain coefficients indicated by "Gnd", "2nd" and "Up" are called a first gain coefficient, a second gain coefficient and a third gain coefficient, respectively. The gain coefficient is a value at the wavelength at which the highest light emission intensity is obtained by the transition between energy levels corresponding to each transition wavelength.

It can be seen that as the injection current is increased, the gain coefficient becomes large. However, how the gain coefficient changes is different among the first to third gain coefficients. At the point that the current linear density is $J_1$, the first gain coefficient curve "Gnd" crosses the second gain coefficient curve "2nd". In the region where the current linear density is lower than $J_1$, the first gain coefficient "Gnd" is larger than the second gain coefficient "2nd", whereas in the region where the current linear density is higher than $J_1$, the second gain coefficient "2nd" is larger than the first gain coefficient "Gnd".

At the point that the current linear density is $J_2$, the second gain coefficient curve "2nd" crosses the third gain coefficient curve "Up". In the region where the current linear density is lower than $J_2$, the second gain coefficient "2nd" is larger than the third gain coefficient "Up", whereas in the region where the current linear density is higher than $J_2$, the third gain coefficient "Up" is larger than the second gain coefficient "2nd".

Consider now the optical amplifier wherein it is sectionalized into three regions along the light propagation direction and current can be injected independently into the active layer in the three regions. The three regions are called first, second and third regions and their lengths are represented by L(1), L(2) and L(3), respectively. The first, second and third gain coefficients in the m-th region are represented by g(gnd, m), g(2nd, m) and g(up, m), respectively. By selecting the length of each region and the current density in each region so as to satisfy the following equation (1), the gains of light having the first to third transition wavelengths can be made equal. Namely, the wavelength dependency of a gain can be made small.

$$\sum_{m=1,2,3} L(m)g(gnd, m) = \sum_{m=1,2,3} L(m)g(2nd, m) = \sum_{m=1,2,3} L(m)g(up, m) \quad (1)$$

In order to satisfy the equation (1), it is sufficient if the following formula (2) is satisfied.

$L(1):L(2):L(3)=(g(\text{gnd},2)-g(\text{up},2))(g(\text{gnd},3)-g(2\text{nd},3))-(g(\text{gnd},2)-g(2\text{nd},2))(g(\text{gnd},3)-g(\text{up},3)):$
$(g(\text{gnd},1)-g(2\text{nd},1))(g(\text{gnd},3)-g(\text{up},3))-(g(\text{gnd},1)-g(\text{up},1))(g(\text{gnd},3)-g(2\text{nd},3)): (g(\text{gnd},1)-g(\text{up},1))(g(\text{gnd},2)-g(2\text{nd},2))-(g(\text{gnd},2)-g(\text{up},2))(g(\text{gnd},1)-g(2\text{nd},1))$ (2)

For example, assuming that the current densities in the first to third regions are 0.1 A/mm, 0.014 A/mm and 0.00475 A/mm, respectively, the lengths L(1), L(2) and L(3) are respectively 41.3%, 0.7% and 58% of the full length of the optical amplifier. The length L(2) is very short relative to the full length of the optical amplifier so that the second region may be omitted.

In the optical amplifier shown in FIG. 1, it is assumed that the current linear densities in the regions R1 and R3 are 0.00475 A/mm and the current linear density in the region R2 is 0.1 A/mm. Namely, the regions R1 and R3 correspond to the third region having the length L(3) and the region R2 corresponds to the first region having the length L(1). If the optical amplifier has a full length of about 25 mm, the total length of the regions R1 and R3 are about 14.5 mm and the length of the region R2 is about 10.4 mm. Although the total length of the regions R1 to R3 is not 25 mm because of omission of the second region, this difference can be absorbed by finely adjusting the total length of the optical amplifier or each region.

Figure 5:
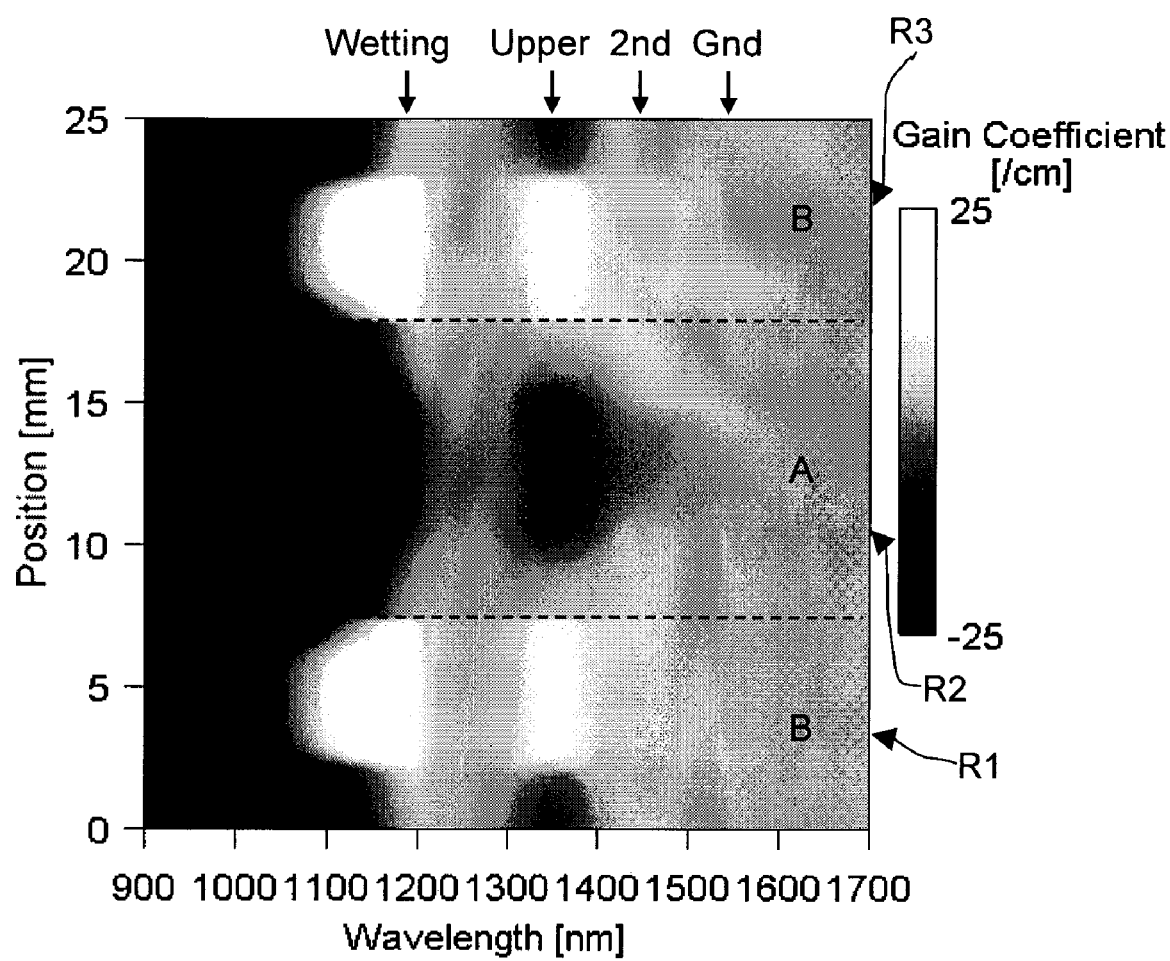
FIG. 5 is a diagram showing the distribution of gain coefficients in the active layer of the semiconductor optical amplifier of the first embodiment.
Figure 6:
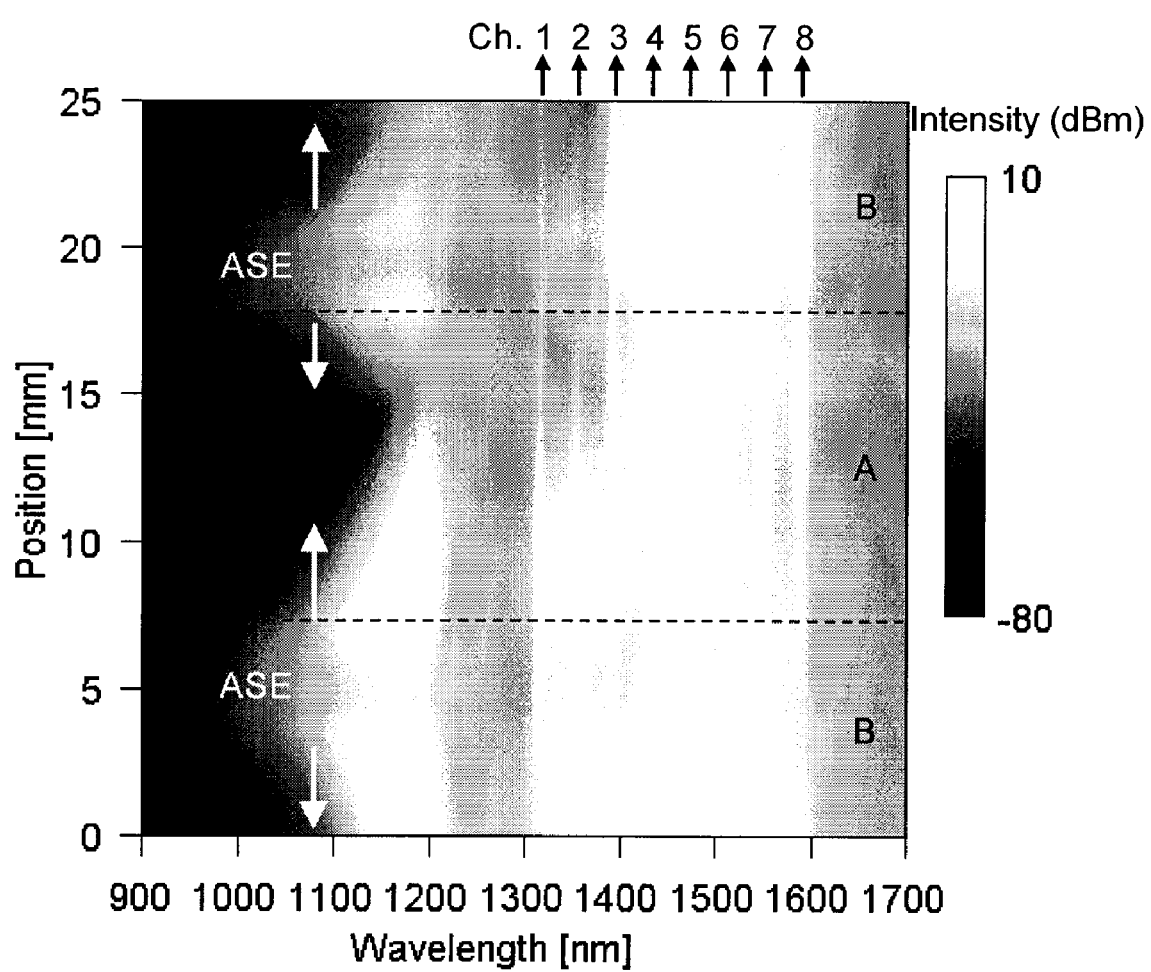
FIG. 6 is a diagram showing the distribution of light intensities in the active layer of the semiconductor optical amplifier of the first embodiment.

FIG. 5 shows the distribution of gain coefficients of the optical amplifier of the first embodiment. FIG. 6 shows the distribution of light intensities in the active layer of the optical amplifier of the first embodiment. In FIGS. 5 and 6, the abscissa represents a wavelength in the unit of "nm" and the ordinate represents a position in the unit of "mm" along the light propagation direction. The lower sides in FIGS. 5 and 6 correspond to the input end face, and the upper sides correspond to the output end face. The gain coefficient is indicated by shading.

It can be seen from the comparison between FIGS. 6 and 15 that the light intensity near at the wavelength of 1200 nm of the first embodiment shown in FIG. 6 is weaker than that shown in FIG. 15 and light amplification in this wavelength range is suppressed. This is because the lengths of the regions R1 and R3 having a high current linear density are shorter than those of FIG. 15 (in FIG. 15, current having the same current linear density as that in the regions R1 and R3 is injected into all the regions).

It can be seen from the comparison between FIGS. 5 and 14 that a dark area near at the end faces of the first embodiment shown in FIG. 5 in the wavelength range from 1300 to 1400 nm is smaller than that shown in FIG. 14. In this dark area, a desired gain coefficient is not obtained because the gain is saturated, although the injected current linear density is high.

In the first embodiment, since light amplification near at the wavelength of 1200 nm is suppressed, gain saturation is hard to occur in the wavelength range from 1300 to 1400 nm.

Figure 7A:
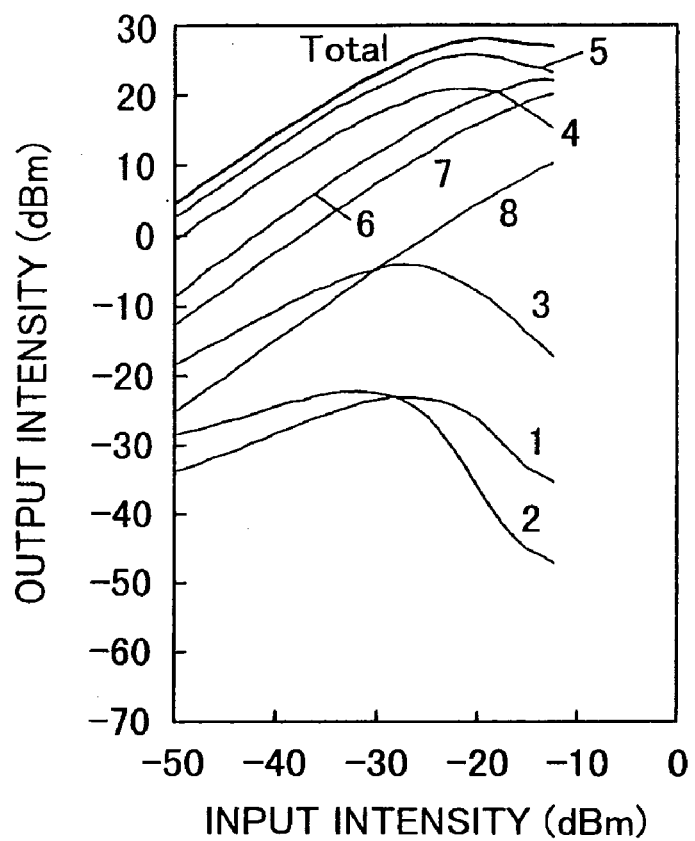
FIG. 7A is a graph showing the relation between an output light intensity and an input light intensity.

FIG. 7A shows the relation between an output light intensity and an input light intensity of the optical amplifier of the first embodiment. It can be seen from the comparison between FIGS. 7A and 16A that the output characteristics of the first to third channels among others are improved.

Figure 7B:
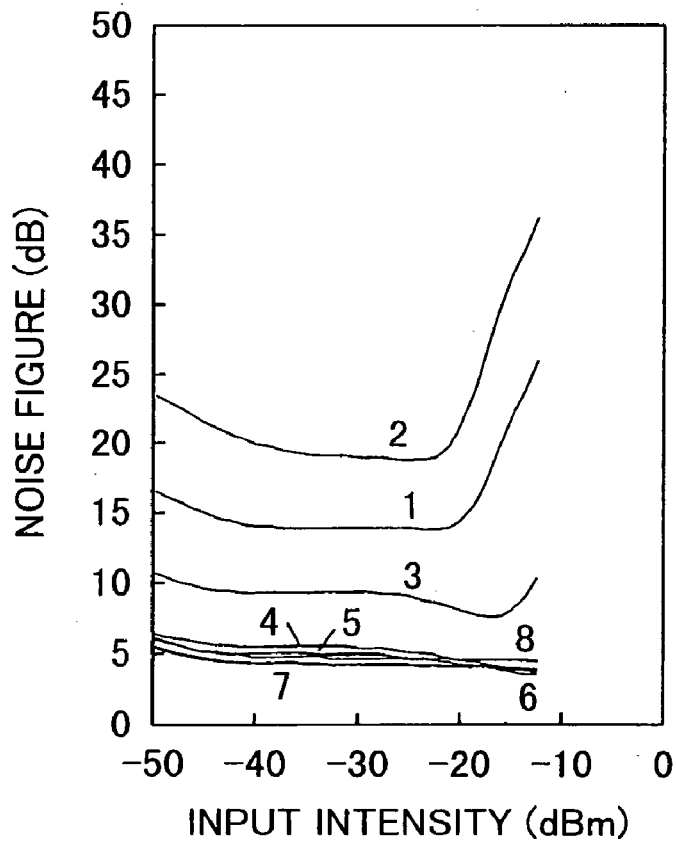
FIG. 7B is a graph showing the relation between a noise figure and an input light intensity, respectively of the semiconductor optical amplifier of the first embodiment.

FIG. 7B shows the relation between an input light intensity and a noise figure of the optical amplifier of the first embodiment. It can be seen from the comparison between FIGS. 7B and 16B that the noise characteristics are improved remarkably.

In the embodiment described above, the current linear densities in the regions R1 and R3 are set to 0.1 A/mm and the current linear density in the region R2 is set to 0.00475 A/mm. One of these two current linear densities is lower than the current density at the cross point between the first and second gain coefficient curves "Gnd" and "2nd" shown in FIG. 4, whereas the other is higher than that at this cross point. Similarly, one of these current linear densities is lower than that at the cross point between the second and third gain coefficient curves "2nd" and "Up", whereas the other is higher than that at this cross point.

One of the current linear densities in two regions of the active layer is set lower than the current linear density at a cross point between two gain coefficient curves at two transition wavelengths, and the other is set higher than that at the cross point. If the gain coefficient at the first transition wavelength in one region of the active layer is high, the gain coefficient at the second transition wavelength in the other region is high. In this manner, it is possible to reduce a gain coefficient difference between two transition wavelengths.

Figure 8:
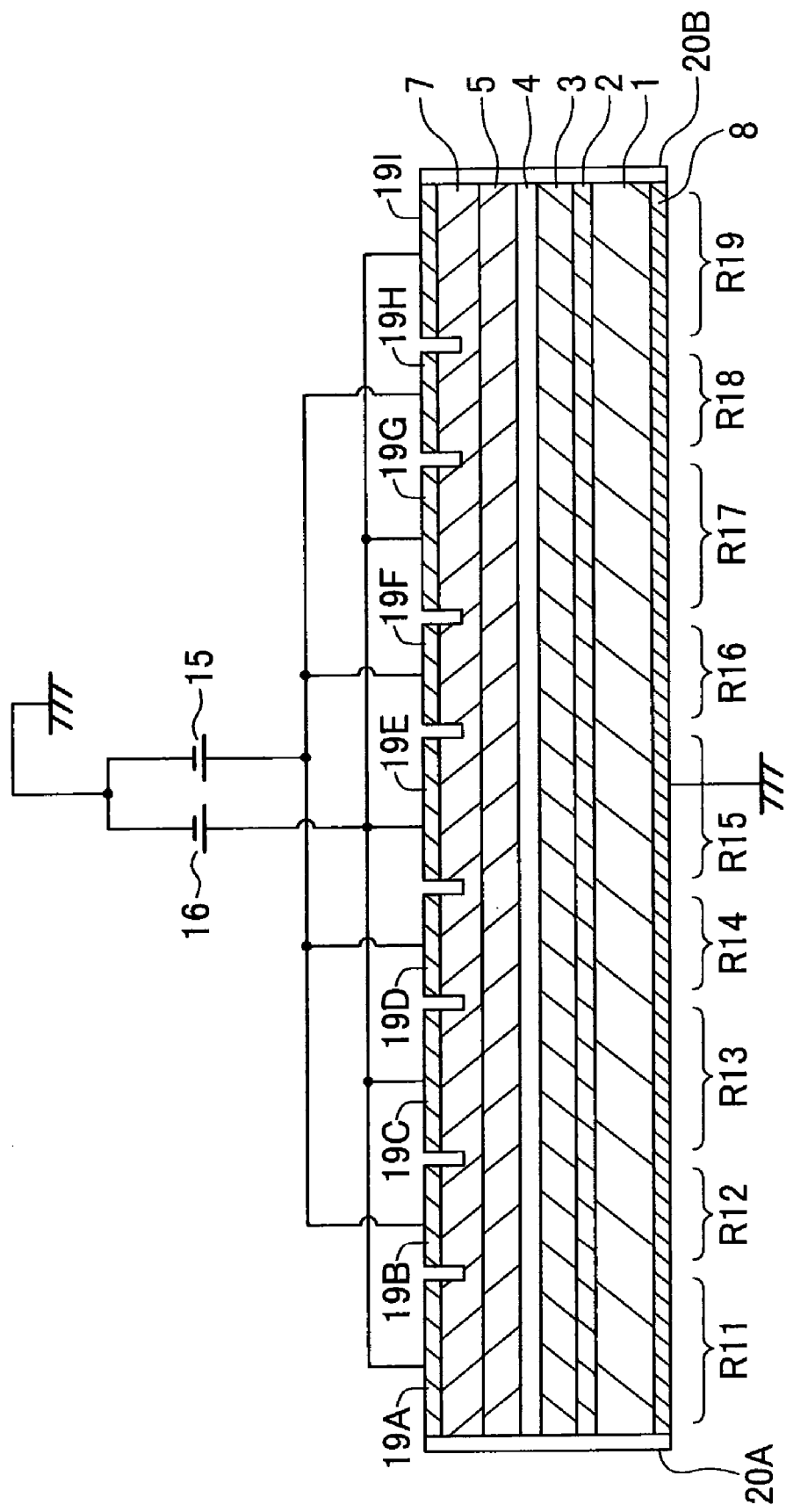
FIG. 8 is a cross sectional view of a semiconductor optical amplifier according to a second embodiment.

FIG. 8 is a cross sectional view of an optical amplifier according to the second embodiment. The lamination structure of the optical amplifier of the second embodiment is the same as that of the first embodiment. In the first embodiment shown in FIG. 1, although the optical amplifier is sectionalized into three regions R1 to R3, in the second embodiment the optical amplifier is sectionalized into nine regions R11 to R19. Electrodes 19A to 19I are formed on the contact layer 7 in the regions R11 to R19.

The electrodes 19A, 19C, 19E, 19G and 19I are connected to a power supply 16, and the other electrodes 19B, 19D, 19F and 19H are connected to another power supply 15. The total length of the regions R11, R13, R15, R17 and R19 is equal to the total length of the regions R1 and R3 of the optical amplifier of the first embodiment shown in FIG. 1. The total length of the regions R12, R14, R16 and R18 is equal to the length of the region R2 of the optical amplifier of the first embodiment.

Current is injected from the power supply 16 at a current linear density of 0.1 A/mm in the regions R11, R12, R15, R17 and R19. Current is injected from the power supply 15 at a current linear density of 0.00475 A/mm in the regions R12, R14, R16 and R18.

Figure 9:
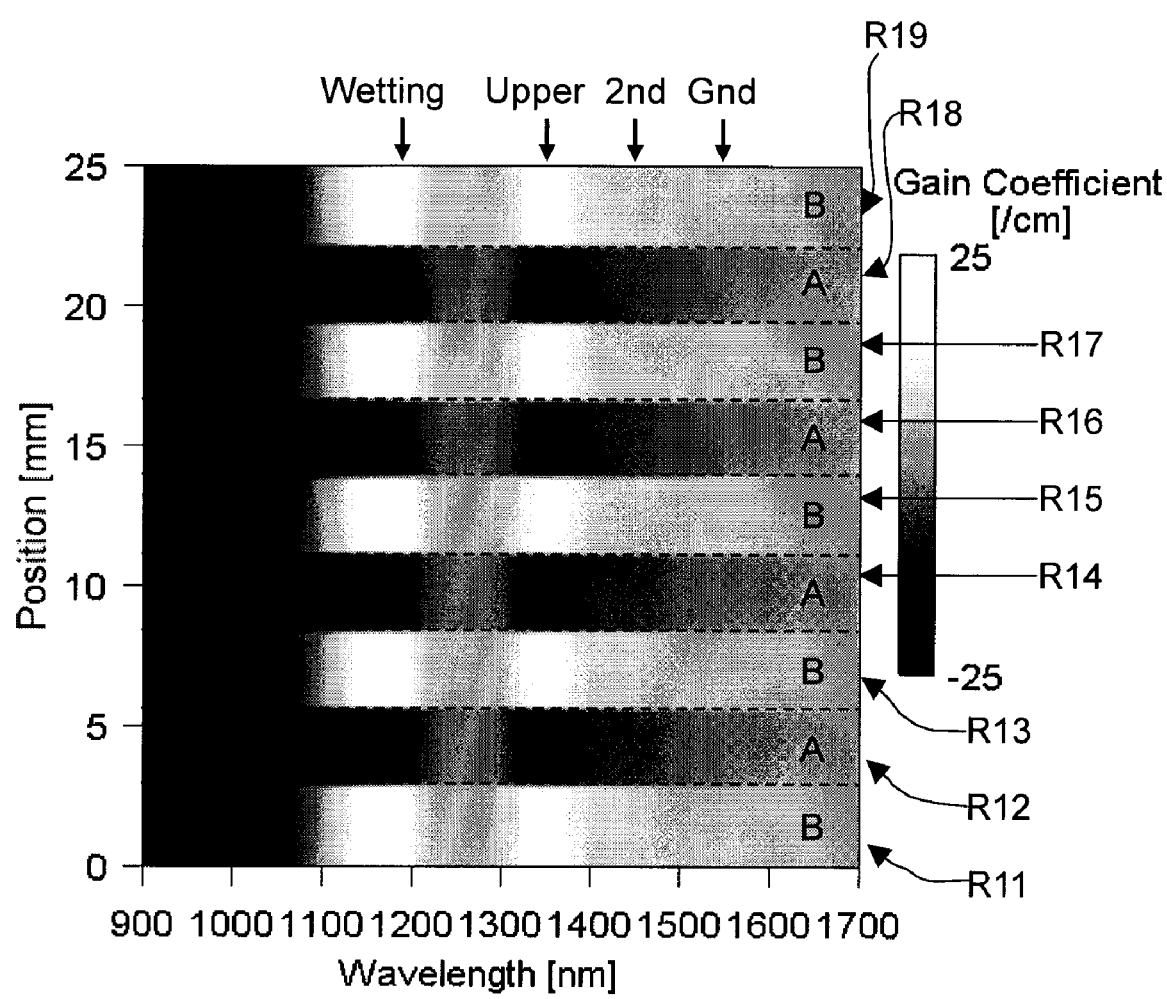
FIG. 9 is a diagram showing the distribution of gain coefficients in an active layer of the semiconductor optical amplifier of the second embodiment.
Figure 10:
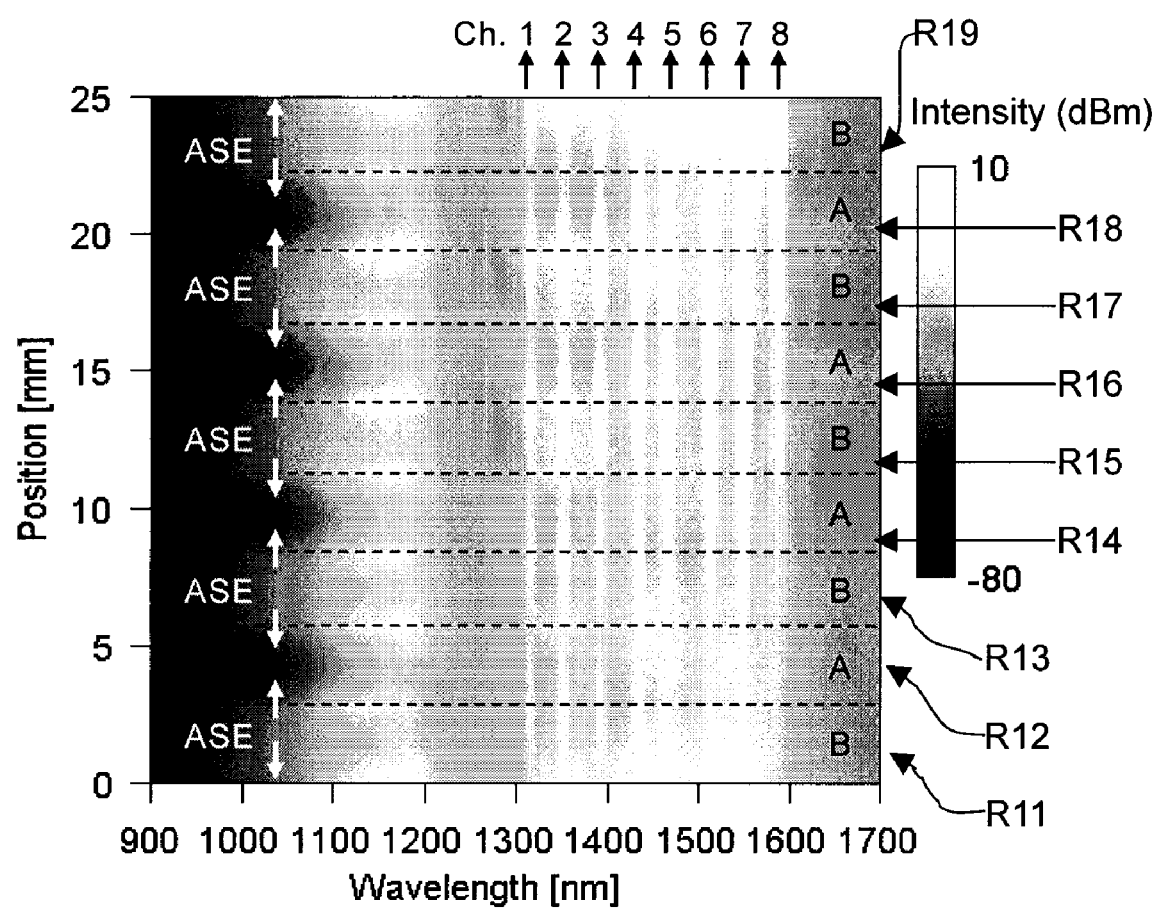
FIG. 10 is a diagram showing the distribution of light intensities in the active layer of the semiconductor optical amplifier of the second embodiment.

FIG. 9 shows the distribution of gain coefficients of the optical amplifier of the second embodiment. FIG. 10 shows the distribution of light intensities in the active layer of the optical amplifier of the second embodiment. In FIGS. 9 and 10, the abscissa represents a wavelength in the unit of "nm" and the ordinate represents a position in the unit of "mm" along the light propagation direction. The lower side in FIGS. 9 and 10 corresponds to the input end face, and the upper side corresponds to the output end face. The gain coefficient is indicated by shading.

It can be seen from the comparison of FIG. 10 with FIG. 6 that the light intensity in the wavelength range from 1100 to 1200 nm is weak. In the second embodiment, because each of the regions having a high current linear density (e.g., regions R11, R13, . . . ) is short, the light intensity does not rise too high even if light in the wavelength range from 1100 to 1200 nm is amplified in the regions having the high current linear density. It is therefore possible to prevent light in the wavelength range from 1100 to 1200 nm from being amplified excessively. If light in the wavelength range from 1100 to 1200 nm is amplified too much, gain saturation occurs.

As seen from FIG. 9, the gain coefficient in the regions R11 to R19 is generally constant along the light propagation direction (vertical direction in FIG. 9). Namely, there is no gain saturation. This is because light amplification is suppressed in the wavelength range from 1100 to 1200 nm.

Figure 11A:
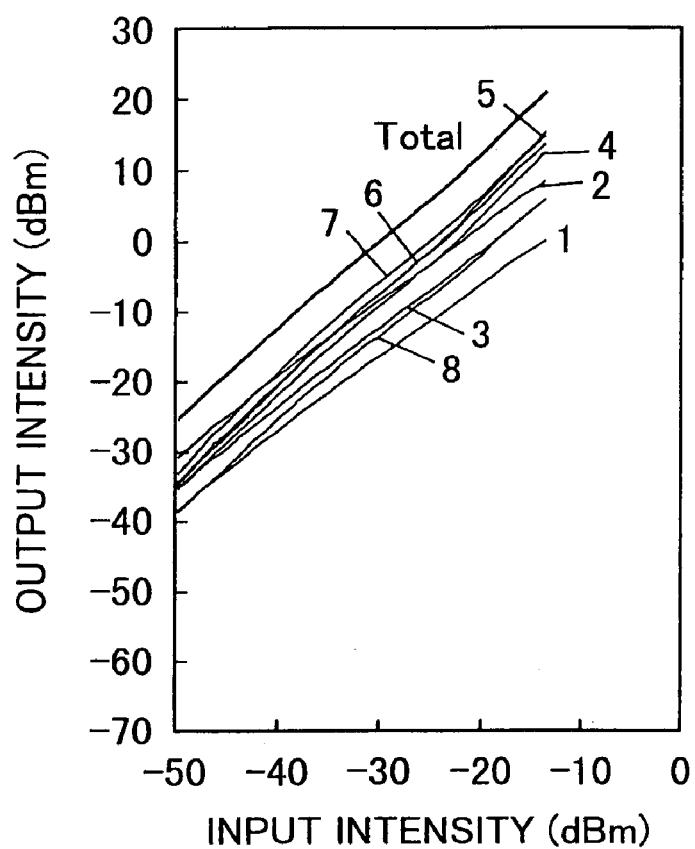
FIG. 11A is a graph showing the relation between an output light intensity and an input light intensity.

FIG. 11A shows the relation between an output light intensity and an input light intensity of the optical amplifier of the second embodiment. It can be seen from the comparison of FIG. 11A with FIG. 7A that the output characteristics are improved remarkably.

Figure 11B:
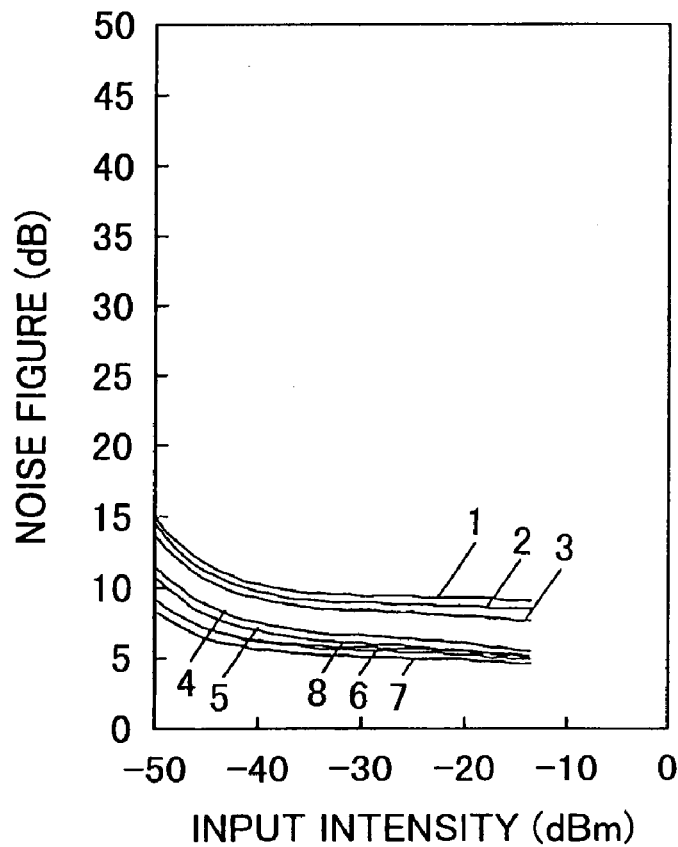
FIG. 11B is a graph showing the relation between a noise figure and an input light intensity, respectively of the semiconductor optical amplifier of the second embodiment.

FIG. 11B shows the relation between an input light intensity and a noise figure of the optical amplifier of the second embodiment. It can be seen from the comparison of FIG. 11B with FIG. 7B that the noise characteristics are improved considerably.

Figure 12:
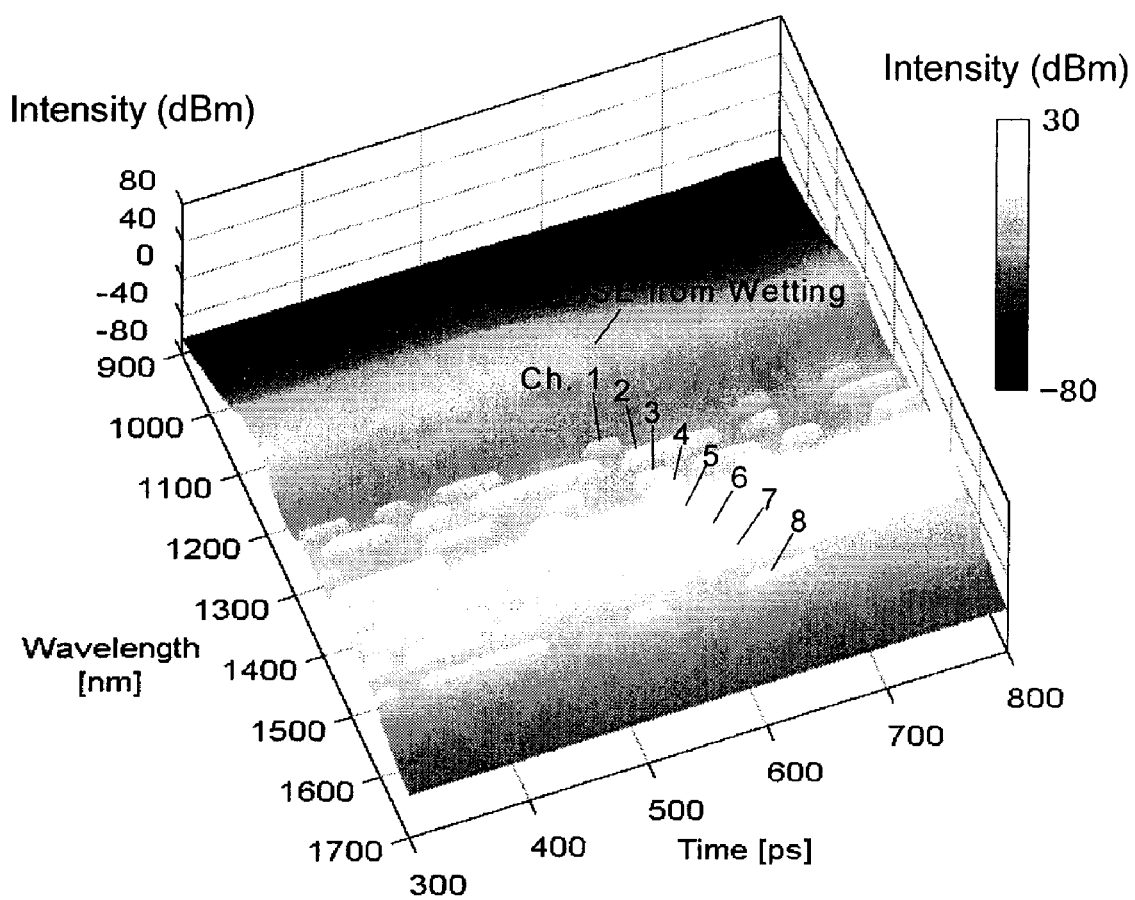
FIG. 12 is a diagram showing a change in a light intensity with time at each wavelength, of the semiconductor optical amplifier of the second embodiment.

FIG. 12B shows a change in an output light intensity with time when an optical signal is input to each channel. The abscissa represents a lapse time in the unit of "ps", the ordinate represents a wavelength in the unit of "nm", and the height represents a light intensity in the unit of "dBm". It can be seen that crosstalk between channels hardly occurs and multiple optical signals can be amplified at the same time.

In the second embodiment, a plurality of regions (sections) with a first current linear density being set are disposed and a plurality of regions with a second current linear density being set are disposed. One region with the second current linear density being set is disposed between the two regions with the first current linear density being set. With this configuration, the length of one section is short so that excessive amplification of light in a particular wavelength range can be suppressed and gain saturation can be prevented.

In the first and second embodiments, each of a plurality of regions (sections) sectionalizing the active layer belongs to one group selected from two groups and the current linear density in each section belonging to the same group is the same. Three or more groups of sections each having the same current linear density may be prepared to make each section of the active layer belong to one group selected from three or more groups.

In this case, it is preferable to adopt the configuration that between two sections belonging to the same group, one section per each of the other groups is disposed. If there are two groups with the same current linear density being set, one section belonging to one group and one section belonging to the other group are alternately disposed.

In the above-described embodiments, although a semiconductor optical amplifier whose active layer has quantum dots is used, an active layer having the quantum structure different from quantum dots may be used. For example, an active layer which contains quantum wires or quantum dashes may also be used. In this case, a quantum wire means a wire region having a low potential and made narrow to such an extent that the carrier levels become disperse. A quantum dash means a quantum wire minutely cut.

Figure 17:
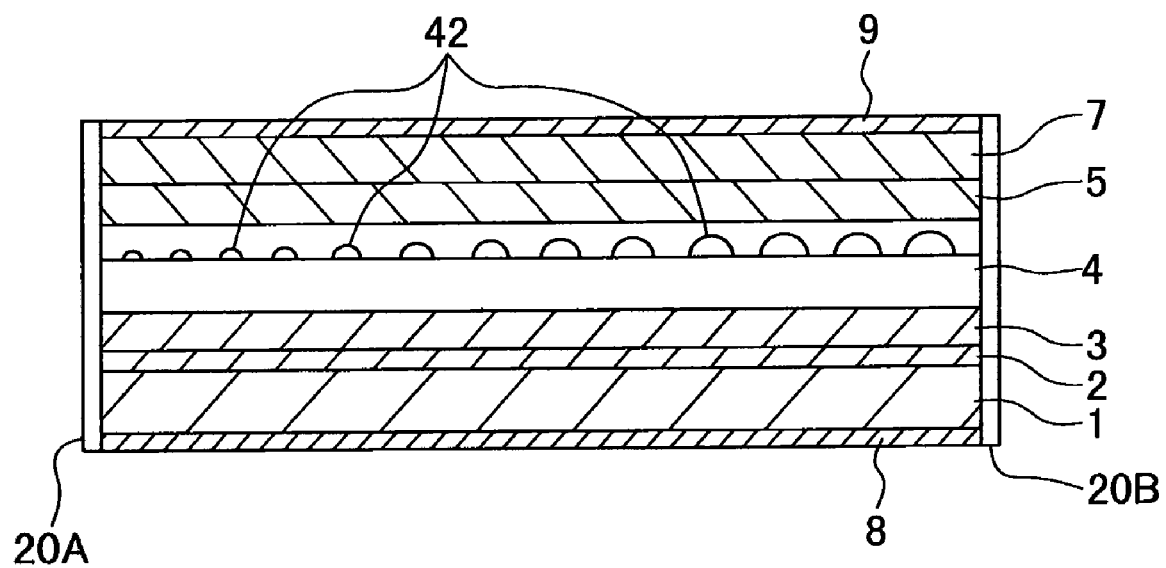
FIG. 17 is a cross sectional view of a semiconductor optical amplifier whose quantum structure size is changed along a light propagation direction.

In the above-described embodiments, it is assumed that the size of each quantum dot is approximately the same throughout the active layer. As shown in FIG. 17, the size of each quantum structure 42 such as a quantum dot may be changed along the light propagation direction. As the size of the quantum structure changes, the shape of a gain spectrum also changes so that the gain changes with a position in the active layer. Namely, advantageous effects similar to those of changing the current linear density described in the above embodiments can be obtained.

The present invention has been described in connection with the preferred embodiments. The invention is not limited only to the above embodiments. It will be apparent to those skilled in the art that other various modifications, improvements, combinations, and the like can be made.

The invention claimed is:

1. A semiconductor optical amplifier comprising:
an active layer containing quantum structures of any of quantum dots, quantum wires and quantum dashes, the active layer amplifying light propagating therein while current is injected therein;
electrodes provided for a plurality of sections of the active layer sectionalized along a light propagation direction, the electrodes being able to inject different currents into the sections; and
a power supply for supplying current to the electrodes, the power supply injecting current into at least one first section selected from the sections of the active layer at a current density such that a gain coefficient of the quantum structures at the longest transition wavelength of the quantum structures becomes larger than a gain coefficient at the second longest transition wavelength, and injecting current into at least one other section different from the first section at a current density such that the gain coefficient of the quantum structures at the longest transition wavelength becomes smaller than the gain coefficient at the second longest transition wavelength.

2. A semiconductor optical amplifier comprising:
an active layer containing quantum structures of any of quantum dots, quantum wires and quantum dashes, the active layer amplifying light propagating therein while current is injected therein;
electrodes provided for a plurality of sections of the active layer sectionalized along a light propagation direction, the electrodes being able to inject different currents into the sections; and
a power supply configured to supply current to the electrodes in such a manner that a first current linear density is set to at least one section of the active layer and a second current linear density is set to at least another section, the first current linear density being lower than a current linear density at a cross point and the second current linear density being higher than the current linear density at the cross point, the cross point being a cross point between gain coefficient curves of at least two different transition wavelengths of the quantum structures, the curves representing a relation between a linear density of current injected into the active layer and a gain coefficient of the active layer.

3. The semiconductor optical amplifier according to claim 2, wherein at least two sections are disposed to which current is supplied at the first current linear density, at least two sections are disposed to which current is supplied at the second current linear density, and one of the two sections to which current is supplied at the second current linear density is disposed between the two sections to which current is supplied at the first current linear density.

4. A semiconductor optical amplifier comprising:
an active layer containing a quantum structure of any of quantum dots, quantum wires and quantum dashes, the active layer amplifying light propagating therein while current is injected therein;
electrodes provided for a plurality of sections of the active layer sectionalized along a light propagation direction, each section belonging to a group selected from at least two groups, and the electrodes injecting different currents into the sections; and
a power configured to supply current to the electrodes in such a manner that current is supplied at a same current linear density to the sections belonging to the same group and current is supplied at different current linear densities to the sections belonging to different groups.

5. The semiconductor optical amplifier according to claim 4, wherein between two sections belonging to the same group, one section per each of all the groups different from the aforementioned same group is disposed.

6. The semiconductor optical amplifier according to claim 4, wherein two groups are provided and a section belonging to one group and a section belonging to the other group are alternately disposed.

7. The semiconductor optical amplifier according to claim 4, wherein the power supply is configured to supply current to the electrodes in such a manner that a first current linear density is set to each section belonging to at least one group and a second current linear density is set to each section belonging to at least another group, the first current linear density being lower than a current linear density at a cross point and the second current linear density being higher than the current linear density at the cross point, the cross point being a cross point between gain coefficient curves of at least two different transition wavelengths of the quantum structure, the curves representing a relation between a linear density of current injected into the active layer and a gain coefficient of the active layer.

8. The semiconductor optical amplifier according to claim 4, wherein a size of each of the quantum structures changes along the light propagation direction.

9. The semiconductor optical amplifier as recited in claim 4, wherein said plurality of sections of the active layer consists of at least three sections.

10. The semiconductor optical amplifier as recited in claim 4, wherein said at least two groups consists of only two groups.

* * * * *